US011683884B2

(12) United States Patent
Souli et al.

(10) Patent No.: US 11,683,884 B2
(45) Date of Patent: Jun. 20, 2023

(54) COMPONENT CARRIER WITH EMBEDDED COMPONENT CONNECTED IN CAVITY BY ANCHORED FIRST AND SECOND POLYMERS

(71) Applicant: AT&S Austria Technologie & Systemtechnik Aktiengesellschaft, Leoben (AT)

(72) Inventors: Imane Souli, Leoben (AT); Erich Preiner, St. Michael in Obersteiermark (AT); Martin Schrei, Mogersdorf (AT); Vanesa López Blanco, Vimianzo (ES)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/304,458

(22) Filed: Jun. 21, 2021

(65) Prior Publication Data
US 2021/0400808 A1     Dec. 23, 2021

(30) Foreign Application Priority Data

Jun. 22, 2020  (EP) .................................... 20181479

(51) Int. Cl.
*H05K 1/03*  (2006.01)
*H05K 1/18*  (2006.01)

(52) U.S. Cl.
CPC ........... *H05K 1/0313* (2013.01); *H05K 1/185* (2013.01)

(58) Field of Classification Search
CPC ........ H05K 1/18; H05K 1/185; H05K 1/0313; H05K 1/03
USPC ...................................................... 174/255
See application file for complete search history.

(56) References Cited

U.S. PATENT DOCUMENTS

2012/0327614 A1   12/2012  Mahler et al.
2019/0139848 A1    5/2019  Ifis et al.

FOREIGN PATENT DOCUMENTS

EP        3 364 456 A2      8/2018

OTHER PUBLICATIONS

Dardel, B.; Extended European Search Report in Application No. 20181479.5; pp. 1-8; dated Jan. 18, 2021; European Patent Office; 80298, Munich, Germany.

*Primary Examiner* — Tremesha S Willis
(74) *Attorney, Agent, or Firm* — Robert A. Blaha; Smith Tempel Blaha LLC

(57) ABSTRACT

A component carrier having a stack with at least one electrically conductive layer structure and/or at least one electrically insulating layer structure and having a cavity delimited at least partially by a first polymer, and a component embedded in the cavity of the stack and being at least partially covered by a second polymer, wherein an anchoring interface is formed at an interface between the first polymer and the second polymer at which the first polymer and the second polymer are mechanically anchored with each other.

15 Claims, 3 Drawing Sheets

COMPONENT CARRIER WITH EMBEDDED COMPONENT CONNECTED IN CAVITY BY ANCHORED FIRST AND SECOND POLYMERS

CROSS-REFERENCE TO RELATED APPLICATION

The present application claims the benefit of the filing date of the European Patent Application No. 20181479.5, filed Jun. 22, 2020, the disclosure of which is hereby incorporated herein by reference.

TECHNICAL FIELD

Embodiments of the invention relate to a component carrier and a method of manufacturing the component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

A shortcoming with laminated component carriers having an embedded component is that they may be prone to delamination, warpage and/or other phenomena which may deteriorate the reliability of the component carrier.

SUMMARY

There may be a need to provide a component carrier with an embedded component having a high reliability.

According to an exemplary embodiment of the invention, a component carrier is provided, wherein the component carrier comprises a (in particular laminated) stack comprising one or more electrically conductive layer structures and/or one or more electrically insulating layer structures and having a cavity delimited at least partially by (in particular coated or lined with) a first polymer (in particular, the cavity may be defined by walls of the stack, which walls may be covered at least partially by the first polymer), and a component embedded in the cavity of the stack and being at least partially covered (in particular coated or lined) by a second polymer, wherein an anchoring interface is formed at an interface between the first polymer and the second polymer at which the first polymer and the second polymer are mechanically anchored with each other.

According to another exemplary embodiment of the invention, a meth-od of manufacturing a component carrier is provided, wherein the method comprises providing a stack comprising one or more electrically conductive layer structures and/or one or more electrically insulating layer structures and having a cavity, at least partially covering a wall of the stack, which wall delimits said cavity, by a first polymer, at least partially covering a component by a second polymer, and embedding the component in the cavity of the stack so that an anchoring interface is formed at an interface between the first polymer and the second polymer along which the first polymer and the second polymer are mechanically anchored with each other.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another. The layer structures of the stack may be connected by lamination, i.e. the application of heat and/or pressure.

In the context of the present application, the term "layer structure" may particularly denote a continuous layer, a patterned layer, or a plurality of non-consecutive islands within a common plane.

In the context of the present application, the term "component" may particularly denote an inlay-type member. Such a component may be arranged in an interior of the stack. A component may in particular have an electronic function and may thus be a heat source in view of ohmic losses. For instance, such a component may be a semiconductor die. However, a component can also have a non-electronic function, such as the function of a heat distribution unit. For instance, such a component may be a copper-based (in particular with or without an insulating coating) or aluminum nitride-based (AlN) inlay. Embedding the component may result in a component being completely buried within stack material. However, embedding the component in the stack may also be accomplished by inserting the component in a cavity in the stack so that the component still has surface contact.

In the context of the present application, the term "cavity" may particularly denote a hollow volume in an interior of the stack (i.e. completely surrounded by stack material) or a recess (such as a blind hole) in a surface of the stack. Said cavity may be shaped and dimensioned for accommodating a component.

In the context of the present application, the term "polymer" may particularly denote large molecules or macromolecules composed of many repeated subunits. Polymers may in particular include synthetic plastics. Polymers, in particular synthetic polymers, may be created via polymerization of many small molecules, which may be denoted as monomers.

In the context of the present application, the term "anchoring interface along which two polymers are mechanically anchored with each other" may particularly denote a transition region between one of said polymers and the other one in which polymer molecules of the two types are mutually mechanically anchored with each other by mechanically interlocking rather than forming a covalent bond or an ionic bond with each other. Such a mechanical anchoring promoting a soft but stable polymer-polymer-connection may be accomplished by phenomena such as interdiffusion and/or entanglement between polymer molecules in the region of the anchoring interface. An anchoring polymer-polymer-connection at the anchoring interface may be accomplished by or may be at least dominated by attracting van der Waals forces. The anchoring interface may be a region of the component carrier which is formed partially of the first polymer and partially of the second polymer. In other words, the anchoring interface may be formed as a mixture of first polymer molecules and second polymer molecules engaging with each other at their mutual interface. In particular, interdiffusion may be based on attracting van der Waals forces and/or the establishment of a concentration gradient. However, there may be also another factor defining how quick interdiffusion proceeds, i.e. the polymers should be in a mobile state for being capable of participating at an efficient interdiffusion. For this reason, it may be for example advantageous that the polymers are sufficiently close to or above their glass transition temperature. Under these circumstances, particularly efficient backbone relaxation (and consequently movement of polymer molecules) may occur. Hence, in addition to an advantageous concentration gradient, sufficient movement of the polymers may trigger interdiffusion particularly efficiently. This may ensure that the interdiffusion process occurs very quickly. For this reason, it may be advantageous to activate (for instance in terms of temperature, pressure, electromagnetic radiation and/or ultrasonic waves) the polymers for promoting formation of the anchoring interface.

According to an exemplary embodiment of the invention, a component carrier is provided, which has an embedded component (such as a semiconductor chip) which is reliably prevented from delamination or causing warpage by the formation of a mechanical rather than covalent polymer-polymer-link or auto-bond at an anchoring interface between a stack surface in a cavity, covered by a first polymer, and the component, covered by a second polymer. More specifically, it may be possible to implement an autohesion connection in the component carrier in order to reduce the conventional restriction of using only glue for embedding of components (such as compounds or inlays) in a component carrier (for instance a printed circuit board). Besides this, it may be possible to benefit from advantageous mechanical properties of polymers. For instance, by appropriately selecting the polymers forming the anchoring interface between component and stack, it may be possible to provide the component carrier with one or more additional functions, such as a flexible design, a long-time fatigue behavior, etc. Advantageously, exemplary embodiments may ensure a proper adhesion of a component embedded in the stack, may extend a lifetime of bonding joints, may provide an opportunity to develop a more flexible design, and may avoid thermal stress of the component carrier and deformation of an embedded component resulting conventionally from the use of an adhesive at high temperatures and pressures. Advantageously, only moderately strong van der Waals forces at the polymer-polymer anchoring interface may result in a flexible soft bond capable of buffering stress, while no significantly stronger covalent bonds dominate the anchoring interface. Such covalent bonds may conventionally result in a brittle bonding being more prone to breakage under stress. By forming a mechanical polymer-polymer anchoring connection between component and stack according to an exemplary embodiment of the invention, it may be possible to reliably protect the embedded component against delamination and the component carrier against warpage, even in the presence of mechanical and/or thermal stress.

In the following, further exemplary embodiments of the method and the component carrier will be explained.

In an embodiment, the first polymer is a different material than the one or more electrically insulating layer structures (for instance comprising a resin such as an epoxy resin, and optionally reinforcing particles such as glass fibers) of the stack adjacent to the cavity. In other words, stack walls for delimiting the cavity may be partially or entirely lined or coated with material of the first polymer which may be provided in addition to and with a different material than the one or more electrically insulating layer structures of the stack.

In an embodiment, the second polymer is a different material than a base body (for instance a semiconductor block with electrically conductive contacts when the component is embodied as a semiconductor chip) of the component. In other words, a surface of a base body of the component may be partially or entirely lined or coated with material of the second polymer which may be provided in addition to and with a different material than the base body.

In an embodiment, the first polymer and the second polymer are different materials. This may allow to specifically select a type of the first polymer for proper adhesion to the stack material and another type of the second polymer for proper adhesion to the component. The first polymer and/or the second polymer may be dielectric.

In another embodiment, the first polymer and the second polymer are the same material. The use of two identical polymers covering component and stack prevents a material bridge at the anchoring interface and avoids any mismatch between the coefficients of thermal expansion of the two polymers. When the first polymer and the second polymer are made of the same material, they may also have the same chain length or may have different chain lengths.

In an embodiment, the first polymer and the second polymer are connected at the anchoring interface by autohesion. Advantageously, formation of an anchoring interface between two (different or identical) polymers may be triggered by autohesion, i.e. direct-bonding or self-bonding. Autohesion may denote the formation of bonds between two surfaces of identical or different polymers, which may be promoted particularly at elevated temperature. Advantageously, autohesion may join or bond polymers without the need for glue.

In an embodiment, the first polymer and the second polymer are anchored by entangling at the anchoring interface. The presence of entanglement may be assumed if a polymer chain crosses an arbitrary plane at least three times. Entangling polymers may form a mechanical polymer-polymer network at the anchoring interface. A short and/or stiff polymer chain hardly tangles, so that it may be very easy to pull the chains apart across an interface. But when being sufficiently long and/or thin, the polymer chains of the first of the second polymer may entangle, and pulling them apart across the anchoring interface is difficult, giving high adhesion.

In an embodiment, the first polymer and the second polymer are anchored by interdiffusion at the anchoring interface. Interdiffusion may be denoted as a concentration-driven motion of polymers at a polymer-polymer interface bringing the two polymers into intimate contact which may result in an automatic formation of a polymer-polymer-interlink. After molecular contact is established between the first polymer and the second polymer, segments of the two polymers may diffuse across the anchoring interface. Hence, the extent of adhesion at the polymer-polymer anchoring interface depends on the extent of diffusion and the interfacial thickness between the two polymers.

In an embodiment, the first polymer and the second polymer are not covalently bound with each other and are not ionically bound with each other. Rather than being covalently bound or forming an ionic bond, the anchoring between the first polymer and the second polymer may be dominated by van der Waals interaction. Advantageously, moderately strong van der Waals forces may result in a flexible bonding capable of buffering stress, whereas much stronger covalent bonds would result in a brittle bonding being more prone to breakage under stress. In contrast to this, attractive multipole van der Waals forces between the first polymer and the second polymer may be highly appropriate for accomplishing a sufficient polymer-polymer-adhesion preventing delamination and warpage within the component carrier.

In an embodiment, the first polymer and the second polymer are configured to not form a three-dimensional covalent network by cross-linking. It is also possible that the first polymer and the second polymer may be non-gluing polymers. Thus, the connection between the polymers at the anchoring interface may be not due to a chemical curing reaction accompanied by the formation of covalent bonds, but may be caused by a mere mechanical polymer-polymer anchoring promoted by van der Waals forces. It is also possible that the first polymer and/or the second polymer is or are already cured before the anchoring interface is formed, but will not be cured during or after forming the anchoring interface. Hence, the mentioned polymers may be applied for the purpose of performing interdiffusion. However, this process may be carried out without cross-linking by formation of covalent bonds between individual polymer-chains during this process. Interdiffusion may be prohibited or at least strongly inhibited by formation of covalent bonds, as a three-dimensional network may not allow large backbone relaxation. Descriptively speaking, the polymers may be non-crosslinking polymers but may mutually attract each other due to van der Waals forces, rather than forming mutual covalent bonds.

In an embodiment, the first polymer and the second polymer are elastically deformable polymers. Preferably, the anchoring interface is elastically deformable. This may be promoted by the van der Waals forces which dominate the bonds between the first polymer and the second polymer. Advantageously, the anchoring interface may form an elastic region within the component carrier which is also capable of functioning as a stress buffer. Thermal and mechanical stress in a transition region between component and stack may thus be buffered or absorbed by the polymer-polymer-interface. It may also be possible that such a polymer material is made of a low Young modulus material having soft material properties and thus providing the function of a mechanical buffer film for buffering mechanical load in an interior of the component carrier. For instance, the mechanically anchored polymer(s) may be made of a low Young modulus material to serve as a soft mechanical buffer. For instance, a value of the Young modulus of the first polymer, the second polymer and/or the anchoring interface may be below 10 GPa, in particular below 4 GPa. Such a low Young modulus material may also suppress warpage.

In an embodiment, at least one of the first polymer and second polymer has side chains with at least 5 carbon atoms, in particular at least 7 carbon atoms. A side chain may denote a chemical group that is attached to a core part of the polymer molecule called main chain or backbone. The side chain may be a hydrocarbon branching element of the polymer molecule that is attached to a larger hydrocarbon backbone. Descriptively speaking, the longer the side chains connected to the polymer backbone of the first polymer and/or of the second polymer, the higher is the tendency of the respective polymer for mechanically anchoring with the other polymer at the side chains.

In an embodiment, at least one of the first polymer and the second polymer has side chains with at least one functional group. In particular, such functional groups may be adjusted for further promoting bonding properties of the respective polymer. More particularly, it may be possible to tune the polymer(s)' ability to undergo interdiffusion with functional groups. Thereby, it may be possible to increase the amount of dipoles, which may lead to increased van der Waals forces.

In an embodiment, at least one of the first polymer and the second polymer is a branched polymer. Branched polymers may have secondary polymer chains linked to a primary backbone. For instance, branched polymers may result in a variety of polymer architectures such as star, H-shaped, and comb-shaped polymers. Branched polymers have a pronounced tendency of forming mechanical anchoring connections with other polymers and are therefore highly appropriate as first polymer and/or second polymer.

In an embodiment, at least one of the first polymer and the second polymer comprises at least one of the group consisting of polyetheretherketone (PEEK), polyamidoamine (PAMA), polyether sulfone (PES), and polyphenylene sulfide (PPS). Also polyamide (PA), polyimide (PI), polyethylene (PE), polytetrafluoroethylene (PTFE), acrylonitrile butadiene styrene (ABS), poly(methyl methacrylate) (PMMA), etc., may be appropriate choices of the material of the first polymer and/or the second polymer. By selecting the materials of both the first polymer and the second polymer from the mentioned group of polymers, an anchoring interface may be formed. However, other appropriate polymer materials are possible as well.

In an embodiment, the first polymer covers at least part of sidewalls of the stack, which sidewalls delimit the cavity. Additionally or alternatively, the first polymer delimits at least part of a bottom and/or a top of the cavity. It is also possible that the entire cavity is delimited by the first polymer.

In an embodiment, the polymer-covered sidewalls which delimit the cavity taper towards a bottom of the cavity. Correspondingly, it may be possible to provide the component covered with the second polymer so that the arrangement of component and second polymer has tapering exterior sidewalls. In particular, the second polymer on at least part of the sidewalls of the component may have an inhomogeneous thickness, in particular may taper towards a bottom of the cavity. Such a taper-taper (for instance cone-cone) geometry of cavity and component may ensure a form closure and a self-centering when inserting the tapering component in the tapering cavity. In particular, this may also promote the formation of a shear force between the first polymer and the second polymer upon inserting the component in the cavity. Furthermore, such a geometry may simplify insertion of the component in the cavity due to the guiding or centering function of the tapering sidewalls of the cavity and/or the component.

In an embodiment, the second polymer covers at least part of sidewalls of the component. Additionally or alternatively, the second polymer covers at least part of a bottom surface and/or a top surface of the component. It is also possible that the entire surface of the component is covered by the second polymer.

In an embodiment, the method comprises creating a shear force between the first polymer and the second polymer when inserting the component in the cavity. Advantageously, it may also be possible to establish a press-fit connection between the first polymer and the second polymer when inserting the component in the cavity. Hence, shear forces and/or pressing forces may be exerted between the first polymer delimiting at least partially the cavity and the second polymer covering at least part of the surface of the component to be embedded. Descriptively speaking, shear forces between molecules of the first polymer and molecules of the second polymer at the anchoring interface may promote entangling, anchoring, interlocking, etc., between the polymers. Such shear forces may be created by pressing the component in the cavity particularly in the presence of a tapering configuration, for instance for establishing a press-fit connection.

In an embodiment, the method comprises promoting a connection between the first polymer and the second polymer by surface activation of the first polymer and the second polymer in particular in the interface region. For example, such as surface activation may be accomplished by irradiation with ultraviolet (UV) radiation. Surface activation of the two polymer materials may improve adhesion within the component carrier. However, in particular enhanced interdiffusion may be achieved by applying for instance heat, pressure, electromagnetic radiation (such as UV light, X-rays, IR (infrared radiation) or microwaves). In addition to this, ultrasonic waves may be implemented to provide an accelerating effect on interdiffusion. A main reason why surface activation may be advantageous is that this may induce back-bone movement and/or relaxation. This may promote a sufficiently pronounced interdiffusion. Hence, the inserted energy can be made advantageously sufficiently high in order to bring the polymers close to or above their glass transition temperature which may increase backbone relaxation. In order to achieve improved bonding, surface properties of the polymers can be enhanced by a prior plasma treatment as well. Thereby, the polarity of the polymer surface can be increased.

In an embodiment, the method comprises forming one or both of said polymers by physical vapor deposition (PVD, e.g. by sputtering or RF sputtering), chemical vapor deposition (CVD, e.g. plasma enhanced CVD or metalorganic CVD), atomic layer deposition (ALD) and/or plasma spraying. Depending on the size and geometry of the component, spray- and tip-coating may be implemented in order to apply the perspective polymer as well. In the context of the present application, the term "sputtering" may particularly denote a coating method in which microscopic particles of a solid material are ejected from its surface, after the material is itself bombarded by energetic particles of a plasma or gas. The ejected particles form the coating material for the component or the cavity, i.e. the respective polymer.

In the context of the present application, the term "physical vapor deposition" may particularly denote a coating method used to produce a vapor that can be deposited on the component or the stack walls as a thin polymer coating. A PVD process may be carried out in a vacuum chamber.

In the context of the present application, the term "chemical vapor deposition" may particularly denote a vacuum deposition method used to produce high quality, high-performance, solid materials. A CVD process may be used to produce a thin film constituting the respective polymer.

In the context of the present application, the term "atomic layer deposition" may particularly denote a thin-film deposition technique based on the sequential use of a gas phase chemical process. ALD may be considered as a subclass of chemical vapor deposition. ALD reactions may use at least two chemicals called precursors reactants for creating the respective polymer.

However, other methods of depositing polymers on at least part of a surface of a component or the stack delimiting the cavity may be applied as well.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer, or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal, and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC, LLC of Wilmington, Del., U.S.A. Reinforcing structures such as webs, fibers, or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component, which can be embedded in the stack, can be selected from a group consisting of an electrically non-conductive inlay (such as a ceramic inlay, preferably comprising aluminum nitride (AIN)), an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer, or a further component carrier, for example in a board-in-board configuration. The component may be surface mounted on the component carrier and/or may be embedded in an interior thereof. Moreover, also other components, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
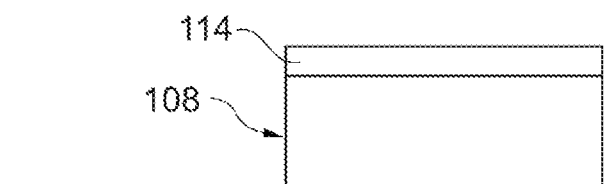
FIG. 1, FIG. 2 and FIG. 3 illustrate cross-sectional views of structures obtained during carrying out a method of manufacturing a component carrier, shown in FIG. 3, according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a component to be embedded in a layer stack of a component carrier may be provided with an improved bonding and design flexibility. More specifically, a component or inlay may be properly connected or linked to the main board via interdiffusion and/or autohesion at a polymer-polymer anchoring interface. Such an anchoring interface may be formed by creating a direct physical contact between a first polymer delimiting at least partially a cavity in a stack and a second polymer coating at least part of the component to be inserted in the cavity.

In an embodiment, it may be possible to deposit a first polymer on a surface portion of a cavity in a layer stack. Furthermore, it may be possible to deposit a second polymer layer onto a component (in particular a chip) surface. For deposition, it is for instance possible to use spin-coating, sputtering, chemical vapor deposition (CVD), etc. Examples for appropriate deposited polymers are in particular acrylates, polyetherketones, etc. Advantageously, it may be possible to form a stable connection between component and stack via an interdiffusing polymer structure composed of the first polymer and the second polymer experiencing autohesion at an anchoring interface. Thereby, it may be possible to embed a component into a carrier, such as a main board, with high mechanical and thermal reliability.

Many approaches are adopted for embedding of components and inlays into a main board. A conventionally formed glue bonding requires however high energy, which may induce deformation and/or damage to the encapsulated components or inlays. In addition, because of the joint deterioration over time and the potential release of toxic agents from the glue, glue bonding is not the ideal approach in many applications (for instance medical applications, etc.).

According to an exemplary embodiment of the invention, it may be possible to improve the adhesion between a component (in particular an inlay) and the layer stack of the component carrier and increase the lifetime of the joint between component and stack. Advantageously, this may be ensured by creating a mechanical anchoring, in particular an autohesion or an interdiffusion, between a polymer deposited earlier on the component and another polymer within the stack. Said two polymers may then be brought into mutual direct physical contact at a low thermal energy. The resulting polymer-polymer anchoring may improve the bonding between component and stack and may improve the design flexibility of components to the main board, preferably via interdiffusion or autohesion.

Challenges in terms of embedded components (for instance semiconductor chips, inlays, or boards) are to ensure adhesion after production and in the event of cyclic thermomechanical loads over the full operational lifetime of a component carrier or its constituents (such as a core, an inlay, an adhesive resin, etc.). What concerns mechanical performance and stress distribution, conventional glue joints may have some risks to fail. Conventionally used glue may have poor resistance to peel or cleavage loads. A number of glues are sensitive to the rate at which the joint is stressed. Rigid, brittle glues sometimes have excellent tensile or shear strength but have very poor impact strength. Operating environmental factors are capable of degrading an adhesive joint in various ways. If more than one environmental factor (such as heat and moisture) is acting on the preform of the component carrier, their combined effect can be expected to produce a pronounced result of reducing adhesive strength.

According to exemplary embodiments of the invention, polymers such as polyethersulfone (PES), polyalkylmethacrylate (PAMAs), polyphenylene sulfide (PPS), polyurethane (PUR) and polydimethylsiloxane (PDM) may be used for improving bonding and design flexibility of embedded inlays and other components in the printed circuit board (PCB). Specifically, exemplary embodiments of the invention may embed prepared components (such a semiconductor chips or any other inlays) into a layer stack (such as a main board) via deposition of polymers with high miscibility or chemical affinity. The formation of such a mechanical anchoring connection between polymer and polymer may improve the bonding of embedded components within a component carrier via mechanisms such as interdiffusion or autohesion.

In particular, it may be possible to carry out a pre-micro etching process to take advantage of the convex shape of the bottom surface of both through hole and vias configuration, which may contribute to reverse sputtering at different angles. Furthermore, it may be possible to use high kinetic and thermal energies to increase diffusion of the deposited atoms.

Figure 2:
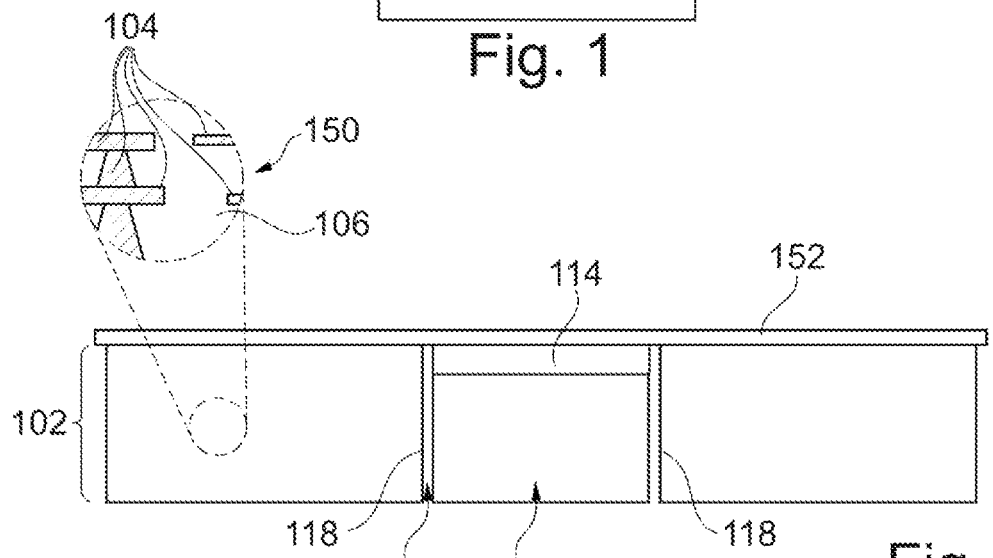
Figure 3:
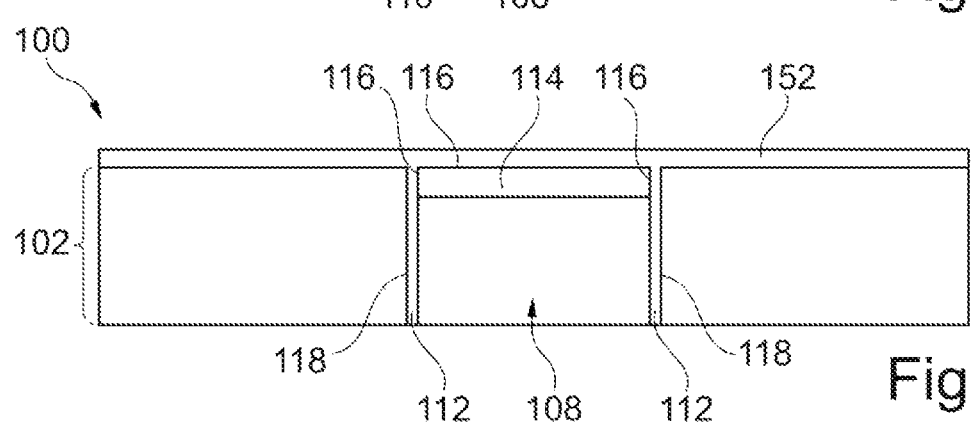

FIG. 1 to FIG. 3 illustrate cross-sectional views of structures obtained during carrying out a method of manufacturing a component carrier 100, shown in FIG. 3, according to an exemplary embodiment of the invention.

Referring to FIG. 1, a component 108 to be embedded within component carrier 100 is illustrated. For instance, component 108 may be a semiconductor chip. As shown in FIG. 1, an upper main surface of the component 108 is coated with a polymer 114. For example, polymer 114 may be deposited on top of component 108 by chemical vapor deposition. Hence, in order to obtain what is shown in FIG. 1, it may be possible to deposit the thin monolithic polymer 114 on the top surface of the component 108.

Referring to FIG. 2, a laminated layer stack 102 is shown which comprises electrically conductive layer structures 104 and electrically insulating layer structures 106 (compare detail 150). Lamination may particularly denote the connection of the layer structures 104, 106 by the application of pressure and/or heat. For example, the electrically conductive layer structures 104 may comprise patterned copper foils and vertical through-connections, for example copper filled laser vias which may be created by plating. The electrically insulating layer structures 106 may comprise a respective resin (such as a respective epoxy resin), optionally comprising reinforcing particles therein (for instance glass fibers or glass spheres). For instance, the electrically insulating layer structures 106 may be made of prepreg or FR4.

The illustrated laminated layer stack 102 has a cavity 110 in which the component 108, processed as described referring to FIG. 1, is inserted. For example, the cavity 110 may be formed by mechanically cutting, by laser cutting, by etching, etc. In a lateral direction, cavity 110 is delimited by sidewalls 118 of the laminated layer stack 102. As shown as well in FIG. 2, an electrically insulating polymeric sheet 152 is placed on top of the stack 102 in which the component 108 has been inserted. In order to obtain the structure shown in FIG. 2, the component 108 is positioned in cavity 110. Electrically insulating sheet 152, comprising or consisting of a polymer material, is attached with intimate contact on top of polymer 114 deposited on component 108. The structure shown in FIG. 2 is ready for subsequent lamination.

Referring to FIG. 3 and as a result of an inlay assembly, the electrically insulating sheet 152 is laminated to stack 102 and component 108 which is covered on its top side with polymer 114. As a result of this lamination, first polymer 112 of electrically insulating sheet 152 flows into tiny gaps between the component 108 and the sidewalls 118 of the stack 102 delimiting the cavity 110. Consequently, a polymer-polymer connection is formed between first polymer 112 and second polymer 114. After the lamination, the first polymer 112 also covers sidewalls 118 of the cavity 110. As shown, the component 108 is embedded in the cavity 110 of the stack 102 so that an anchoring interface 116 is formed between the first polymer 112 and the second polymer 114 along which the first polymer 112 and the second polymer 114 are mechanically anchored with each other.

As a result, component carrier 100 according to an exemplary embodiment of the invention is obtained. The component carrier 100 comprises the laminated layer stack 102 with cavity 110 being delimited partially by first polymer 112. Furthermore, component 108 is embedded in the cavity 110 of the stack 102 and is partially covered by second polymer 114. Anchoring interface 116 is formed between the first polymer 112 and the second polymer 114 along which the first polymer 112 and the second polymer 114 are mechanically anchored with each other. The first polymer 112 and the second polymer 114 may be different materials or may be the same material. The materials of the polymers 112, 114 may be, for instance polyethersulfone (PES), polyalkylmethacrylate (PAMAs), polyphenylene sulfide (PPS), polyurethane (PUR), or polydimethylsiloxane (PDM). Also polyamide (PA), polyimide (PI), polyethylene (PE), polytetrafluoroethylene (PTFE), acrylonitrile butadiene styrene (ABS), poly(methyl methacrylate) (PMMA), etc., are possible materials of the first polymer 112 and/or the second polymer 114.

When the first polymer 112 and the second polymer 114 as well as their mixture in anchoring interface 116 are elastically deformable, i.e. have a sufficiently small Young modulus of preferably less than 4 GPa, they may also function as a mechanical buffer protecting the embedded component 108 from thermal and mechanical stress. Descriptively speaking, component 108 is then embedded in a soft environment.

Preferably, first and second polymer as 112, 114 may be non-adhesive polymers forming a mutual polymer-polymer link by autohesion. Preferably, the first polymer 112 and the second polymer 114 have sufficiently long side chains of 7 or more carbon atoms connected to a carbon backbone and may be branched polymers. Long side chains and pronounced branching of polymers 112, 114 promote the formation of a strong mechanical anchoring interface 116 by getting entangled.

Concluding, the described embodiment may be obtained by depositing a determined thin polymer film (for example polyetheretherketone (PEEK), alkyl methacrylate (PAMAs)) on an already prepared component 108, see FIG. 1. Subsequently, the component 108 is positioned in cavity 110. An intimate contact between the component 108 and the stack 102 can be established under defined low temperature and pressure. Thereby, chemical bonds formed at the polymer 112-polymer 114 anchoring interface 116 can greatly enhance the bonding strength between the component 108 and the stack 102.

The chemical nature of the polymer-polymer link at anchoring interface 116 will be described in further detail referring to FIG. 4.

Figure 4:
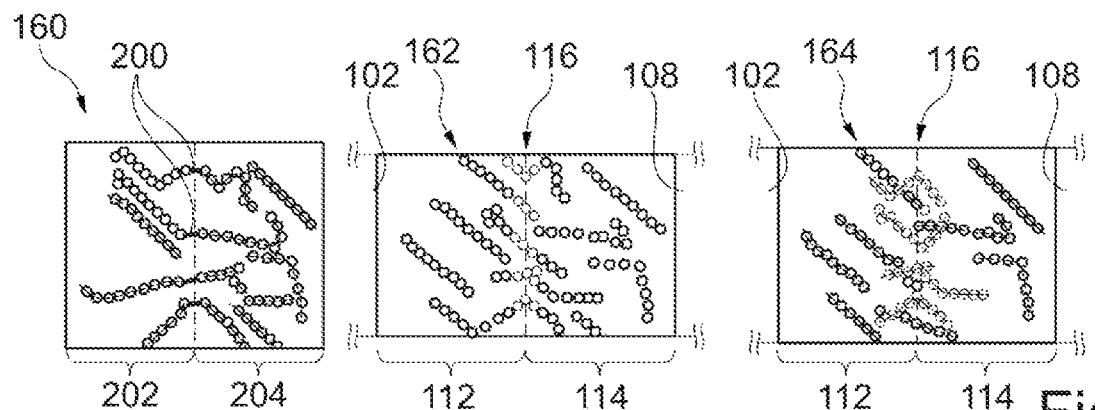
FIG. 4 illustrates conventional molecular polymer-polymer bonding, as well as different views of mechanical polymer-polymer anchoring mechanisms based on interdiffusion and entanglement for connecting an embedded component in a component carrier according to an exemplary embodiment of the invention.

FIG. 4 illustrates on the left-hand side a conventional molecular polymer-polymer bonding. In the middle and on the right side, FIG. 4 illustrates different views of mechanical polymer-polymer anchoring mechanisms based on interdiffusion (central illustration) and entanglement (illustration on the right-hand side) for connecting an embedded component 108 to a stack 102 of a component carrier 100 according to an exemplary embodiment of the invention.

In a conventional molecular bonding 200 as illustrated with reference sign 160, a first polymer 202 and a second polymer 204 may be bonded by a covalent bond or the like.

According to exemplary embodiments of the invention, the first polymer 112 and the second polymer 114 are not (or at least not predominantly) bound with each other by a covalent or ionic bond. In particular, the first polymer 112 and the second polymer 114 are anchored by interdiffusing at the anchoring interface 116, see reference sign 162. It is also possible that the first polymer 112 and the second polymer 114 may be anchored by entangling at the anchoring interface 116, see reference sign 164. Preferably, polymer 112-polymer 114 autohesion may be predominantly based on a mechanical anchoring accompanied by van der Waals interactions. Direct bonding or self-bonding, i.e. autohesion, may denote the spontaneous formation of sufficiently strong bonds between two surfaces. Autohesion may have the advantage of clean and precisely joint strong bond surfaces without the need of adhesives. In order to achieve improved bonding by autohesion, it may be advantageous to enhance the polymer surface properties by a prior plasma treatment.

While reference sign 160 describes the conventional formation of a molecular bond rather than a mechanical anchoring, reference sign 162 visualizes mechanical anchoring by interdiffusion and reference sign 164 visualizes mechanical anchoring by entanglement.

Figure 5:
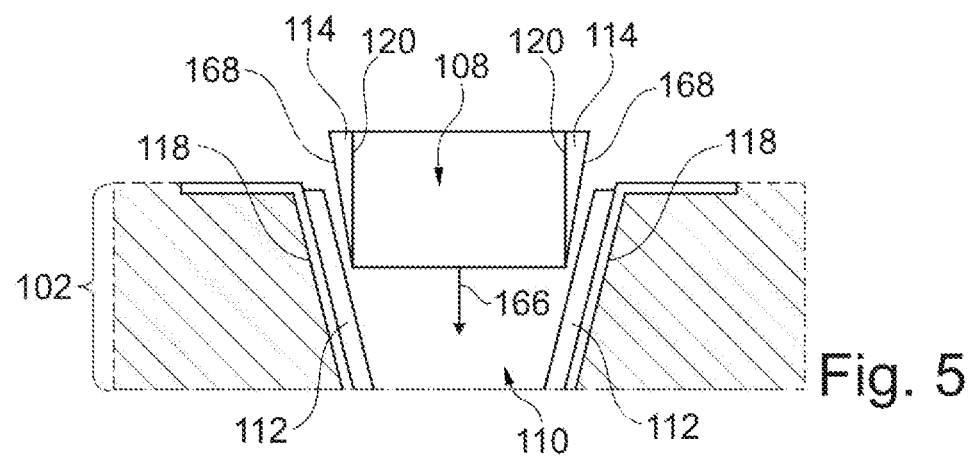
FIG. 5 illustrates a cross-sectional view of a structure obtained during carrying out a method of manufacturing a component carrier according to another exemplary embodiment of the invention.

FIG. 5 illustrates a cross-sectional view of a structure obtained during carrying out a method of manufacturing a component carrier 100 according to another exemplary embodiment of the invention.

According to FIG. 5, the inner sidewalls 118 of the stack 102, which sidewalls 118 laterally delimit cavity 110 in the laminated layer stack 102, taper towards a bottom of the cavity 110. Correspondingly, the second polymer 114 on sidewalls 120 of the component 108 has an inhomogeneous thickness distribution (which decreases in a downward direction) and has slanted sidewalls 168 which taper towards a bottom of the cavity 110. When inserting the component 108 in the cavity 110 as illustrated by arrow 166, a press-fit connection may be established between the first polymer 112 and the second polymer 114. Due to the described slanted geometry on the sidewalls 118 of cavity 110 and the correspondingly slanted sidewalls 168 of the second polymer 114 covering sidewalls 120 of component 108, a shear force may be created between the first polymer 112 and the second polymer 114 when inserting the component 108 in the cavity 110. It is believed that such a shear force may promote formation of an anchoring interface 116 with a mechanical anchoring-type polymer-polymer bond. Slanted sidewalls 118, 168 may have the same slanting angle, i.e. may be arranged parallel to each other. Alternatively, it is possible that sidewalls 168 are slanted stronger (i.e. deviate stronger from a vertical orientation) than sidewalls 118, which may further increase the shear force and may thereby further improve the polymer-polymer bond. In the latter embodiment, the difference between the slanting angles may be in a range from 1° to 10°.

Hence, the embodiment of FIG. 5 relates to a V-shaped cavity 110 and an angular distribution of the deposited film forming second polymer 114. This may be achieved by a controlled polymer film deposition on the sidewalls 120 of the component 108 resulting in an inhomogeneous film deposition. Consequently, a reliable polymer-polymer bonding may be generated due to an applied extra pressure. For example, the tapering (for example conical) shape of the cavity 110 can be generated during a milling process or within film deposition.

Figure 7:
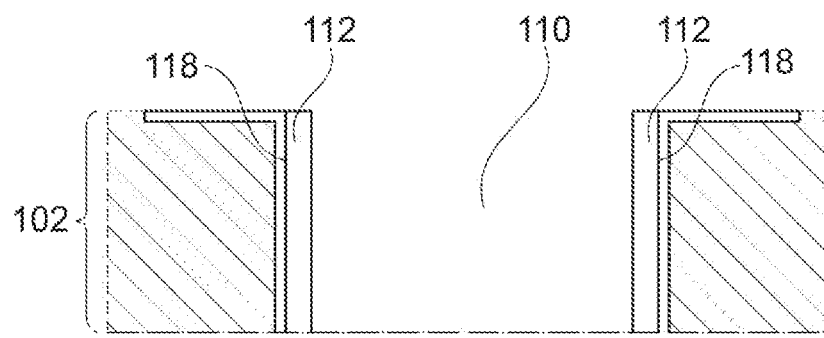
Figure 8:
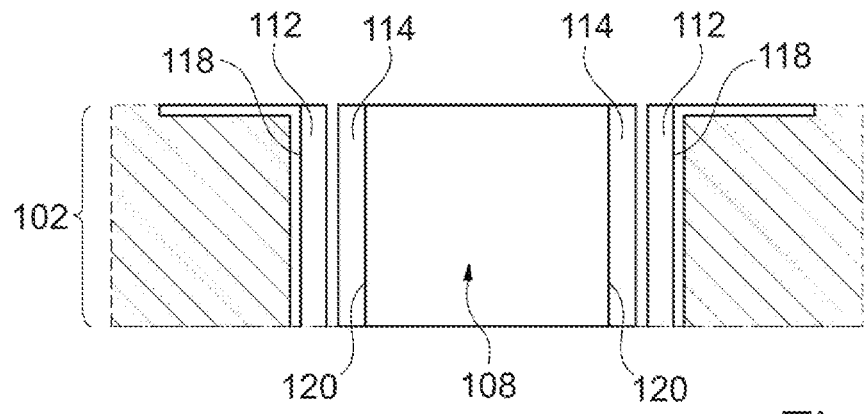
Figure 9:
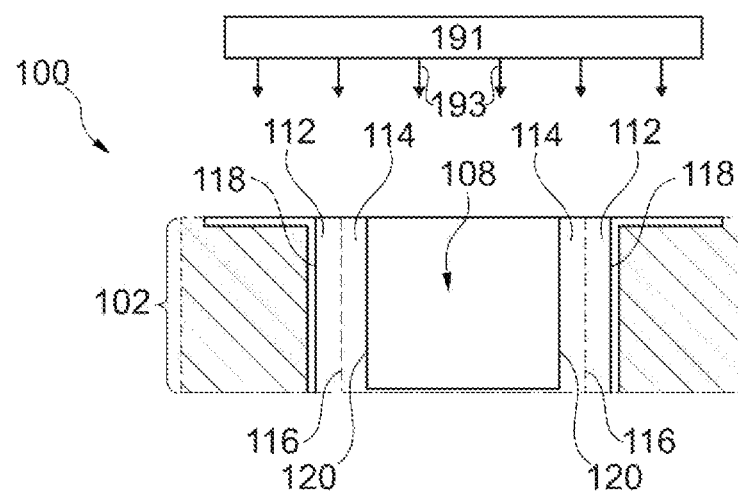

FIG. 6 to FIG. 9 illustrate cross-sectional views of structures obtained during carrying out a method of manufacturing a component carrier 100, shown in FIG. 9, according to still another exemplary embodiment of the invention.

Figure 6:
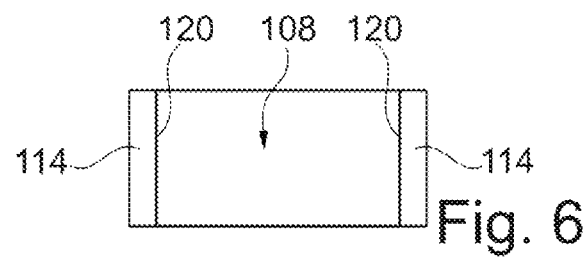
FIG. 6, FIG. 7, FIG. 8 and FIG. 9 illustrate cross-sectional views of structures obtained during carrying out a method of manufacturing a component carrier, shown in FIG. 9, according to still another exemplary embodiment of the invention.

Referring to FIG. 6, a component 108 is shown which is covered with a second polymer 114. Component 108 shown in FIG. 6 differs from the embodiment of FIG. 1 in that, according to FIG. 6, sidewalls 120 of the component 108 rather than the top main surface of the component 108 is covered with the second polymer 114. This can be achieved by a polymer film deposition selectively onto the sidewalls 120 of the component 108.

Referring to FIG. 7, a cavity 110 in stack 102 is coated selectively on sidewalls 118 with the first polymer 112. This can be accomplished by carrying out a polymer film deposition on interior sidewalls 118 of the main board, i.e. stack 102.

The assembly shown in FIG. 8 may be obtained by inserting component 108, processed according to FIG. 6, into the cavity 110, configured according to FIG. 7.

Referring to FIG. 9, surface activation of both polymers 112, 114 is illustrated, for instance by irradiation with ultraviolet radiation 193 created by an ultraviolet radiation source 191. A connection between the first polymer 112 and the second polymer 114 may be promoted or improved by the surface activation. In this embodiment, in-situ deposition can be carried out as well.

Figure 10:
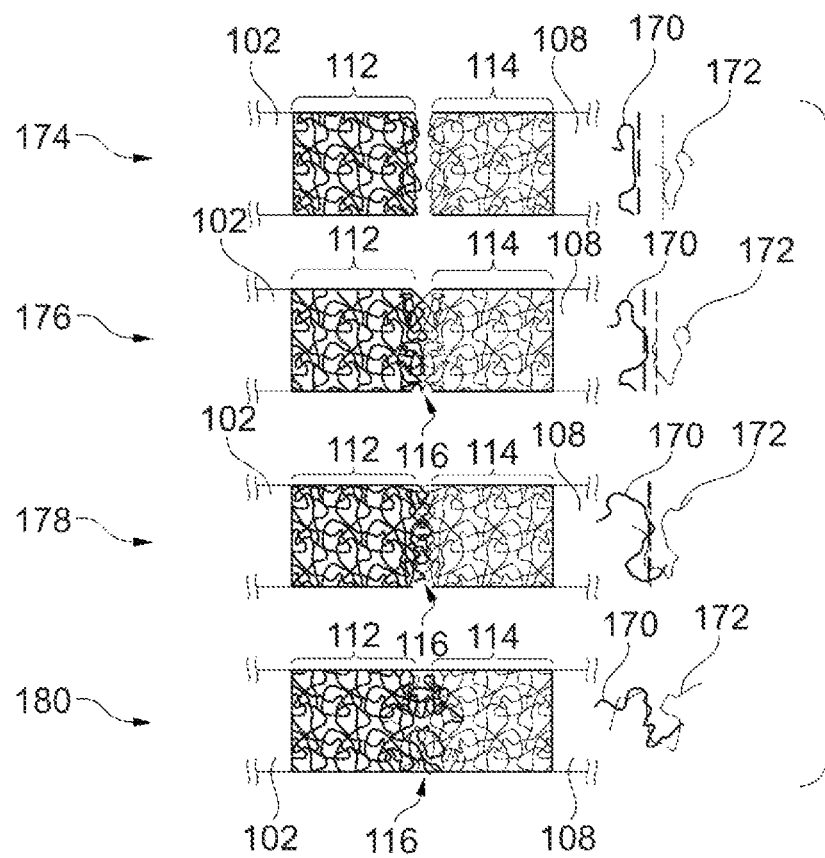
FIG. 10 and FIG. 11 describe interdiffusion of polymers as used for embedding a component in a cavity of a stack of a component carrier according to an exemplary embodiment of the invention.
Figure 11:
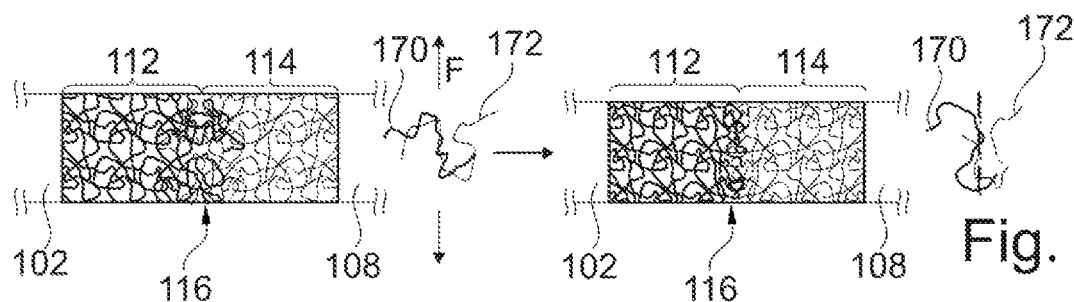

FIG. 10 and FIG. 11 describe interdiffusion of polymers 112, 114 as used for embedding a component 108 in a cavity 110 of a stack 102 according to exemplary embodiments of the invention. In each of the illustrations in FIG. 10 and FIG. 11, a left-hand side shows an interface model between a first polymer 112 and a second polymer 114 before and after establishing an anchoring interface 116. A right-hand side of each of these illustrations shows a corresponding molecular model illustrating a first polymer molecule 170 of first polymer 112 and a second polymer molecule 172 of second polymer 114.

Referring to illustration 174 in FIG. 10, the polymers 112, 114 are locally separated, and they need to be brought into contact for establishing a connection. The closer the polymers 112, 114 come, a rearrangement of the polymers 112, 114 occurs based on the specific interaction of these polymers 112, 114.

Referring to illustration 176 in FIG. 10, wetting of the surfaces occurs. More specifically, the polymers 112, 114 get in touch with each other and establish a certain mutual interaction.

Referring to illustration 178 in FIG. 10, induced diffusion between polymers 112, 114 occurs due to van der Waals interactions. Low-level diffusion starts between the surfaces.

Referring to illustration 180 in FIG. 10, enhanced interdiffusion occurs, as—with decreasing distance—van der Waals forces between polymers 112, 114 will increase.

Now referring to the left-hand side of FIG. 11, if a force F is applied to the polymers 112, 114 at the anchoring interface 116, the entanglement is reduced. Depending on the applied force, the entanglement in parts of the anchoring interface 116 is still intact, but the adhesive force will be reduced. Polymer chains will slide towards each other thereby reducing or even minimizing the stress at the anchoring interface 116. Once the force is removed as shown on the right-hand side of FIG. 11, interdiffusion starts again due to the attracting van der Waals forces, which may result in a healing of the polymer-polymer connection. Self-healing polymers 112, 114 have the ability to transform physical energy into a chemical and/or physical response to heal the damage. Self-healing polymers 112, 114 may therefore respond to an external stimulus to recover the initial material properties. This ensures a reliable, soft, and elastic mechanical anchoring-based bond between polymers 112, 114 for reliably embedding a component 108 in a stack 102 of a component carrier 100.

It should be noted that the term "comprising" does not exclude other elements or steps and the "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
   a stack comprising at least one electrically conductive layer structure and/or at least one electrically insulating layer structure and having a cavity delimited at least partially by a first polymer; and a component embedded in the cavity of the stack and being at least partially covered by a second polymer;

wherein an anchoring interface is formed at an interface between the first polymer and the second polymer at which the first polymer and the second polymer are mechanically anchored with each other, forming a transition region between one of said polymers and the other one of the polymers, in which polymer molecules of the two types are mutually anchored with each other by mechanically interlocking.

2. The component carrier according to claim 1, wherein the first polymer and the second polymer are made of different polymer materials or are made of the same polymer material.

3. The component carrier according to claim 1, wherein the first polymer and the second polymer are connected at the anchoring interface by autohesion.

4. The component carrier according to claim 1, wherein the first polymer and the second polymer are anchored by entanglement of polymer molecules at the anchoring interface.

5. The component carrier according to claim 1, wherein the first polymer and the second polymer are anchored by interdiffusion of polymer molecules at the anchoring interface.

6. The component carrier according to claim 1, further comprising at least one of the following features:
wherein the first polymer and the second polymer form van der Waals bonds with each other at the anchoring interface;
wherein the first polymer and the second polymer do not form covalent bonds and do not form ionic bonds with each other at the anchoring interface.

7. The component carrier according to claim 1, wherein the first polymer and the second polymer are configured to not form a three-dimensional covalent network by cross-linking.

8. The component carrier according to claim 1, wherein the first polymer and the second polymer are non-gluing polymers.

9. The component carrier according to claim 1, further comprising at least one of the following features:
wherein the first polymer and the second polymer are elastically deformable polymers with a value of the Young modulus below 10 GPa;
wherein the anchoring interface is elastically deformable.

10. The component carrier according to claim 1, further comprising at least one of the following features:
wherein at least one of the first polymer and the second polymer has side chains with at least 5 carbon atoms;
wherein at least one of the first polymer and the second polymer has side chains with at least one functional group.

11. The component carrier according to claim 1, wherein at least one of the first polymer and the second polymer is a branched polymer.

12. The component carrier according to claim 1, further comprising at least one of the following features:
wherein at least one of the first polymer and the second polymer comprises at least one of the group consisting of polyetheretherketone, polyamidoamine, polyether sulfone, polyphenylene sulfide, polyamide, polyimide, polyethylene, polytetrafluoroethylene, acrylonitrile butadiene styrene, and poly(methyl methacrylate);
wherein the first polymer covers at least part of sidewalls of the stack, which sidewalls delimit the cavity, wherein the sidewalls which delimit the cavity taper towards a bottom of the cavity;
wherein the first polymer delimits at least part of a bottom and/or a top of the cavity;
wherein the second polymer covers at least part of sidewalls of the component forming a component covered with a second polymer with tapering exterior sidewalls, wherein the second polymer covering at least part of the sidewalls of the component has an inhomogeneous thickness along the sidewalls tapering towards a bottom of the cavity;
wherein the second polymer covers at least part of a bottom surface and/or at least part of a top surface of the component.

13. The component carrier according to claim 1, further comprising at least one of the following features:
wherein the at least one electrically conductive layer structure comprises at least one of the group consisting of copper, aluminum, nickel, silver, gold, palladium, and tungsten;
wherein the at least one electrically insulating layer structure comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
wherein the component carrier is shaped as a plate;
wherein the component carrier is configured as one of the group consisting of a printed circuit board, and a substrate;
wherein the component carrier is configured as a laminate-type component carrier.

14. A method of manufacturing a component carrier, comprising:
providing a stack comprising at least one electrically conductive layer structure and/or at least one electrically insulating layer structure and having a cavity;
at least partially covering a wall of the stack, which wall delimits said cavity, by a first polymer;
at least partially covering a component by a second polymer; and
embedding the component in the cavity of the stack so that an anchoring interface is formed at an interface between the first polymer and the second polymer along which the first polymer and the second polymer are mechanically anchored with each other, forming a transition region between one of said polymers and the other one of the polymers, in which polymer molecules of the two types are mutually anchored with each other by mechanically interlocking.

15. The method according to claim 14, further comprising at least one of the following features:
wherein the method comprises establishing a press-fit connection between the first polymer and the second polymer when inserting the component in the cavity;
wherein the method comprises creating a shear force between the first polymer and the second polymer when inserting the component in the cavity;
wherein the method comprises treating at least one of the first polymer and the second polymer for promoting a connection between the first polymer and the second polymer by surface activation of at least one of the first polymer and the second polymer and/or by promoting interdiffusion between the first polymer and the second polymer, wherein the method comprises treating at least one of the first polymer and the second polymer by at least one of the group consisting of a plasma treatment, supplying heat, exerting pressure, exciting ultrasonic waves, and irradiating with electromagnetic radiation.

* * * * *